United States Patent
Friedrich et al.

[11] Patent Number: 6,160,400
[45] Date of Patent: Dec. 12, 2000

[54] RADIO-FREQUENCY RECEIVER UNIT FOR A MAGNETIC RESONANCE APPARATUS

[75] Inventors: Axel Friedrich, Nuernberg; Helmut Greim, Adelsdorf; Ludwig Kreischer, Dormitz; Jianmin Wang, Erlangen, all of Germany

[73] Assignee: Siemens Aktiengesellschaft, Munich, Germany

[21] Appl. No.: 09/102,609

[22] Filed: Jun. 23, 1998

[30] Foreign Application Priority Data

Jun. 30, 1997 [DE] Germany .............. 197 27 524

[51] Int. Cl.[7] .................. G01R 33/20; G01V 3/00
[52] U.S. Cl. ............................ 324/322; 324/318
[58] Field of Search .................. 324/300–322; 330/210, 295

[56] References Cited

U.S. PATENT DOCUMENTS

| | | | |
|---|---|---|---|
| 4,631,495 | 12/1986 | Mueller et al. ............ | 34/310 |
| 4,731,585 | 3/1988 | Fox ...................... | 324/322 |
| 4,825,162 | 4/1989 | Roemer et al. ............ | 324/318 |
| 5,144,244 | 9/1992 | Kess ..................... | 324/322 |
| 5,473,252 | 12/1995 | Renz et al. .............. | 324/318 |
| 5,964,705 | 10/1999 | Truwit et al. ............ | 600/423 |

FOREIGN PATENT DOCUMENTS

PS 44 22 069  9/1995  Germany .

*Primary Examiner*—Christine K. Oda
*Assistant Examiner*—Tiffany A. Fetzner
*Attorney, Agent, or Firm*—Schiff Hardin & Waite

[57] ABSTRACT

In a radio-frequency receiver unit for a magnetic resonance apparatus, a reception antenna is connected to an input of a noise-matched field-effect transistor preamplifier with a low input impedance. The reception antenna is connected with a detuning stage. The RF receiver unit has a noise suppression stage that can be activated when the reception antenna is detuned.

10 Claims, 4 Drawing Sheets

RADIO-FREQUENCY RECEIVER UNIT FOR A MAGNETIC RESONANCE APPARATUS

BACKGROUND OF THE INVENTION

1. Field of the Invention

The present invention relates to a radio-frequency receiver unit for a magnetic resonance apparatus of the type having a reception antenna that is connected to an input of a noise-matched field-effect transistor preamplifier with a low input impedance.

2. Description of the Prior Art

A radio-frequency receiver unit of the general type described above is known from U.S. Pat. No. 4,825,162. Several radio-frequency receiver units of this sort are used as an array system in imaging with magnetic resonance, in order to detect a magnetic resonance signal simultaneously with several reception coils. Even though such local antennas have the disadvantage of a high signal-to-noise ratio, this arrangement allows their use be used even given large areas of examination. In order to reduce unwanted couplings between the individual reception antennas in the reception mode, the reception antennas are damped by the input impedance of the preamplifiers respectively coupled thereto.

In German PS 44 22 069, a reception antenna for a magnetic resonance apparatus is described that can be detuned by means of a circuit inserted in the antenna conductor.

German OS 38 06 371 describes the problem that a high antenna impedance is the cause of a high noise level.

It would be advantageous if the region of sensitivity (field of view FOV) of the antenna array were additionally alterable, in order to evaluate only signals of particular radio-frequency receiver units, as warranted. The remaining radio-frequency units would then be inactive. This possibility would be of particular interest for all local receiver coils, if an overview image (body survey or scan) is first intended to be produced using a whole-body antenna. Subsequently, high-resolution images (though with only a limited imaging area) could then be produced with local antennas for the actual diagnosis. All reception antennas could then remain physically in the magnetic resonance apparatus, so that a repositioning of the patient during an examination would no longer required be, even if different body areas must be examined successively (e.g., head, cervical and thoracic spinal column or pelvis, upper and lower limbs). It is known to detune local antennas that are used as pure reception antennas during the excitation of the magnetic resonance signals so as to effectively deactivate those antennas. This takes place, for example, by disconnecting the reception antennas in high-ohmic fashion by a switched parallel resonance circuit.

By detuning reception antennas that are switched inactive during the reception-mode, the coupling between the active or receiving and inactive or non-receiving antennas would simultaneously be minimized. A disadvantage of detuning, however is, that the preamplifiers of the inactive radio-frequency reception units respectively emit a very strong noise signal at their outputs. This noise couples to the reception antennas of the active radio-frequency receive units, as well as to the whole-body antenna in case of a body survey, and degrades the signal to noise ratio. If in the above examples the degraded image quality is unacceptable, a possible remedy would be to completely shield the signal line and preamplifier, to prevent coupling. This solution, however, is expensive, and is not always possible for reasons of space.

SUMMARY OF THE INVENTION

An object of the present invention is based on the aim of suppressing the amplifier noise given a detuned receive antenna in an RF receiver unit.

This object is achieved in an RF receiver unit of the type initially described, wherein the reception antenna is connected with a detuning stage, and wherein the RF receiver unit includes a noise suppression stage that can be activated given a detuned reception antenna.

The invention is thus based on the recognition that the high impedance of the detuned receive antenna is the cause of the amplifier noise. That is, given a detuned receive antenna, the noise level at the amplifier output is significantly higher than with a tuned receive antenna.

The noise suppression stage can be arranged at the power supply side or at the operating voltage side of the preamplifier, and can disconnect the preamplifier completely from its power supply when the associated reception antenna is detuned. No disturbing noise signal then is present at all. The power supply of the individual preamplifier thus must be able to be selectively disconnected, which requires a switchable preamplifier power supply for each individual antenna.

In a first embodiment the noise suppression stage of a detuned receiving antenna includes a switch that is arranged at an output of the preamplifier and separates the preamplifier from the output. This embodiment is effective when the coupling of the noise signal from the active or receiving antennas does not proceed directly from the preamplifier, but rather from the circuit parts, of the signal line connected to the output.

According to a second embodiment, the noise suppression stage includes a switch that is arranged before the input of the preamplifier and disconnects the reception antenna from the input when the reception antenna is detuned. This embodiment exploits the fact that the no-load operation at the input of the preamplifier is transformed in the first amplifier stage, by a matching element before the field-effect transistor (FET), into a low source impedance effective for the field-effect transistor. The matching element is provided in the active RF unit for the noise matching of the reception antenna, whereby, given a tuned receive antenna, an optimally high signal level is then produced at the first preamplifier stage. The real part of the signal impedance at the first amplifier stage, acting as a noise source, is thus also low.

In a third embodiment the noise suppression stage includes a series circuit of a switch with a reactance, this series circuit being connected between the input of the preamplifier and a reference potential, and when the reception antenna is detuned the reactance is switched in parallel with the input and the reference potential, and the reactance forms a parallel oscillation circuit with the impedance produced by the remaining circuit parts which is effective at the input of the preamplifier. A very high impedance is thereby produced at the input of the preamplifier, and this impedance is transformed by a matching element into a very low impedance with a low ohmic portion at the first preamplifier stage.

In a fourth embodiment the reception antenna is connected to the beginning of a signal line via a matching network, the end of the signal line is connected to the input of the preamplifier, and a switch is arranged at the start of the signal line, which shorts the signal line when the reception antenna is detuned. The short-circuit at the beginning of the signal line is transformed by the signal line into a high resistance at the input of the preamplifier, and this resistance is in turn transformed by a matching element into a very low source impedance at the input of the first preamplifier stage.

DESCRIPTION OF THE PREFERRED EMBODIMENTS

Figure 1:
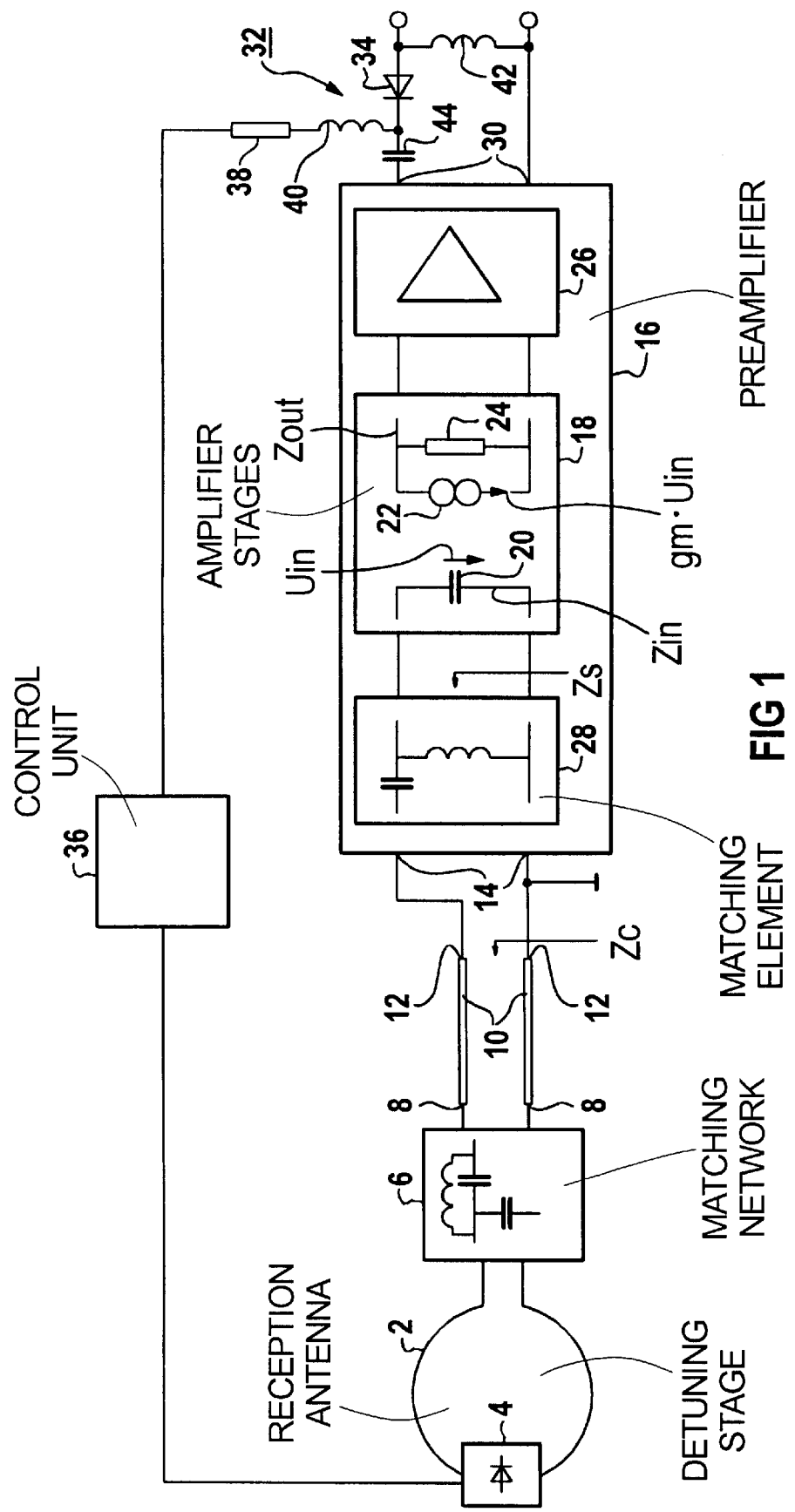
FIG. 1 shows a circuit diagram of an RF receiver unit with a switched preamplifier output in a first embodiment of the invention.

The RF receiver unit described below on the basis of the four figures is part of an RF receiver system of a diagnostic magnetic resonance apparatus. The RF receiver system includes several such RF receiver units. Each RF receiver unit has a reception antenna 2, fashioned e.g. as part of an antenna array. The antenna array can, for example, be built into a patient table (not shown). The reception antenna 2 can also be matched to a specific area of examination, as a local antenna. Several reception antennas 2, each belonging to a separate RF receiver unit, also can be fastened individually to a patient, in order to receive magnetic resonance signals from the respective examination areas. The reception antennas 2 can be individually detuned or deactivated by a detuning stage 4. The detuning stage 4 can be formed, for example, by a switched parallel resonance circuit that disconnects the reception antenna 2 in high-ohmic fashion for detuning, but which is not effective in the tuned state of the reception antenna 2.

In the tuned state (with patient), the reception antenna 2 has a relatively low impedance, on the order of magnitude of 5 to 10Ω, transformed to 50Ω via a matching network 6. A beginning 8 of a signal line 10 constructed as a coaxial line is connected go the matching network 6. The signal line 10 has a wave resistance of 50 Ω. The end 12 of the signal line 10 is connected with the input 14 of a noise-matched preamplifier 16 with a low input impedance. As a first amplifier stage 18, a low-noise field-effect transistor is used in the preamplifier 16, modeled by an input capacitor 20 (Zin), a voltage-controlled power source 22 (gm·Uin) and an output resistor 24 (Zout). A second amplifier stage 26 is connected to the first amplifier stage 18. For noise matching, a matching element 28 is connected between the input 14 of the preamplifier 16 and the first amplifier stage 18, with which the receiver signal from the patient (including the patient noise) is transformed at the input of the first amplifier stage 18 to a highest possible signal voltage Uin at the input capacitor 20 of the field-effect transistor. The matching element 28 causes the impedance Zc, effective at the input 14 of the preamplifier 16, to be transformed from 50 Ω to a real source impedance Zs of about 200 to 500 Ω, effective at the reference level at the input of the first amplifier stage 18. The signal voltage Uin at the input capacitor 20, which is decisive for the gain of the first amplifier stage 18, thereby also is maximized. The matching element 28 thus causes the impedance Zc, effective at the input 14 of the preamplifier 16, to be transformed from 50 Ω to a real source impedance of about 500 to 1000 Ω, effective at the input of the first amplifier stage.

Given a detuned reception antenna 2, the high impedance of the reception antenna 2 is transformed by the matching network 6 and the signal line 10 to an impedance of typically 1 Ω, effective at the input 14 of the preamplifier 16. This small effective impedance Zc is transformed by the matching element 28 to a high, substantially real source impedance Zs of 5–10 kΩ. Because the noise voltage is proportional to the root of the ohmic portion of the source impedance Zs, the noise voltage occurring at the input capacitor 20 increases correspondingly.

So that the amplified noise voltage, in particular from successive circuit parts, cannot couple into active receive antennas from other RF receiver units, in the exemplary embodiment shown in FIG. 1, a controlled RF switch 32 is arranged at the output 30 of the preamplifier 16. The RF switch 32 is formed by an RF switching diode 34, e.g. a PIN diode, that is inserted into the signal line. The RF switching diode 34 can be changed over into the blocking state or into the conductive state by means of a direct control signal. The corresponding control signals are supplied to the RF switching diode 34 by a control unit 36, via a resistor 38 and a blocking inductor 40. The control signal is prevented from proceeding beyond this point by a further blocking inductor 42 which feeds the control signal to the reference conductor.

A capacitor 44 prevents the direct current signals from flowing into the second amplifier stage 26 of the preamplifier 16.

The control unit 36 also provides the signal for the detuning of the reception antenna 2.

In the exemplary embodiment shown in FIG. 1, a considerable noise voltage is still produced in the first amplifier stage 18, but this voltage is not relayed to the signal line connected to the output 30; in the exemplary embodiments specified on the basis of FIGS. 2 to 4 (wherein components which are the same as those already described in connection with FIG. 1 have the same legends and reference characters), it is also the case that excessive voltages are not produced inside the preamplifier 16.

Figure 2:
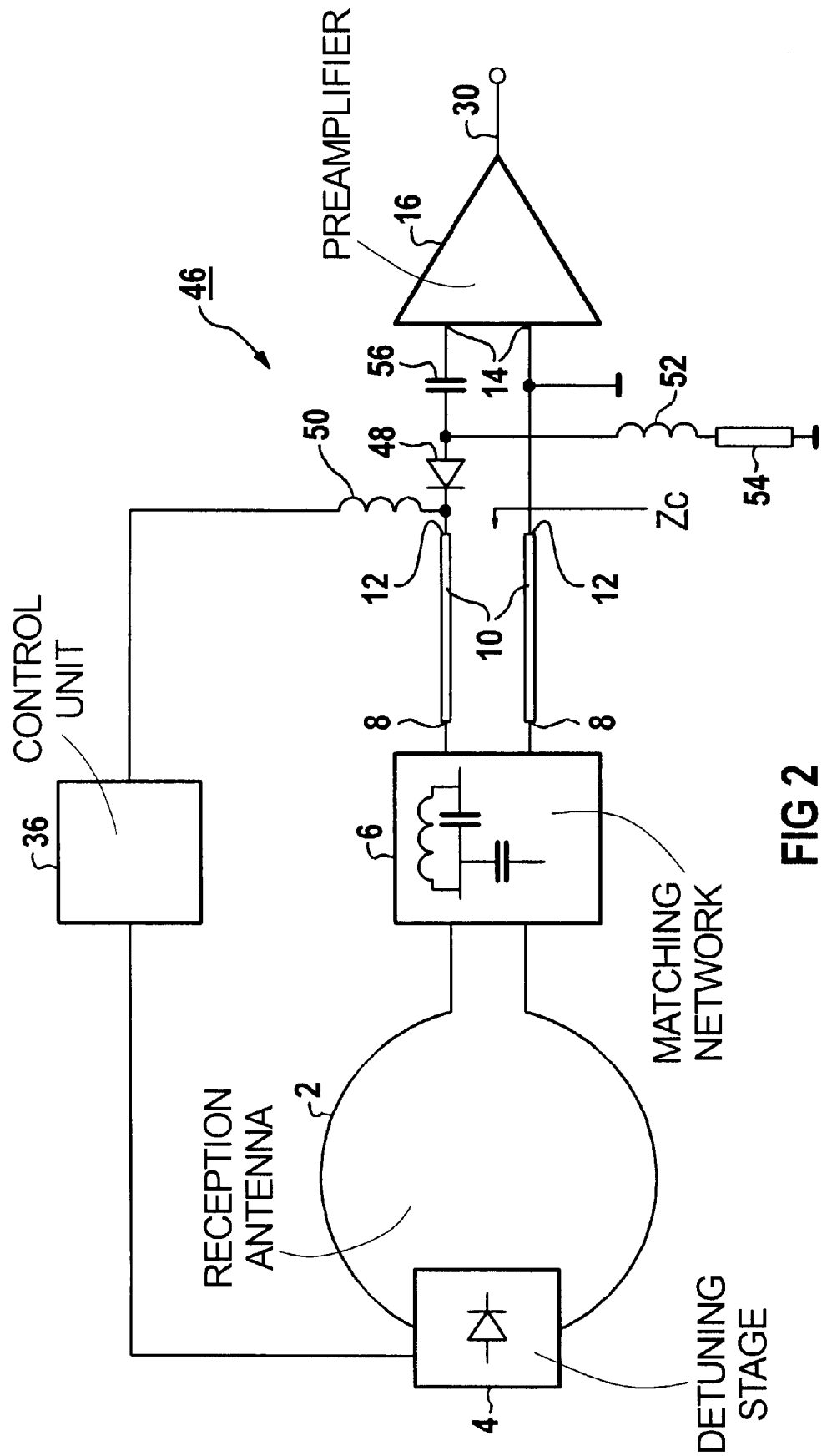
FIG. 2 shows a circuit diagram of an RF receiver unit with a switched preamplifier input, in a second embodiment of the invention.

In the exemplary embodiment shown in FIG. 2, an RF switch 46 is inserted between the end 12 of the signal line 10 and the input 14 of the preamplifier 16. The RF switch 46 is formed by an RF switching diode 48, e.g. a PIN diode, which is biased by means of blocking inductors 50 and 52, with a resistor 54 provided for current limitation. A blocking capacitor 56 prevents further flowing of the control signals, which are present as direct current signals. If a signal for detuning the reception antenna 2 is emitted by the control unit 36, then at the same time the RF switching diode 48 is charged with a blocking voltage, so that the signal line 10 is disconnected from the input 14 of the preamplifier 16 (which is as shown in FIG. 1). The quasi-no-load operation at the input 14 is transformed into a very low source impedance by the matching element 28 in the preamplifier 16, so that the noise voltage at the capacitor 20 is also correspondingly low.

Figure 3:
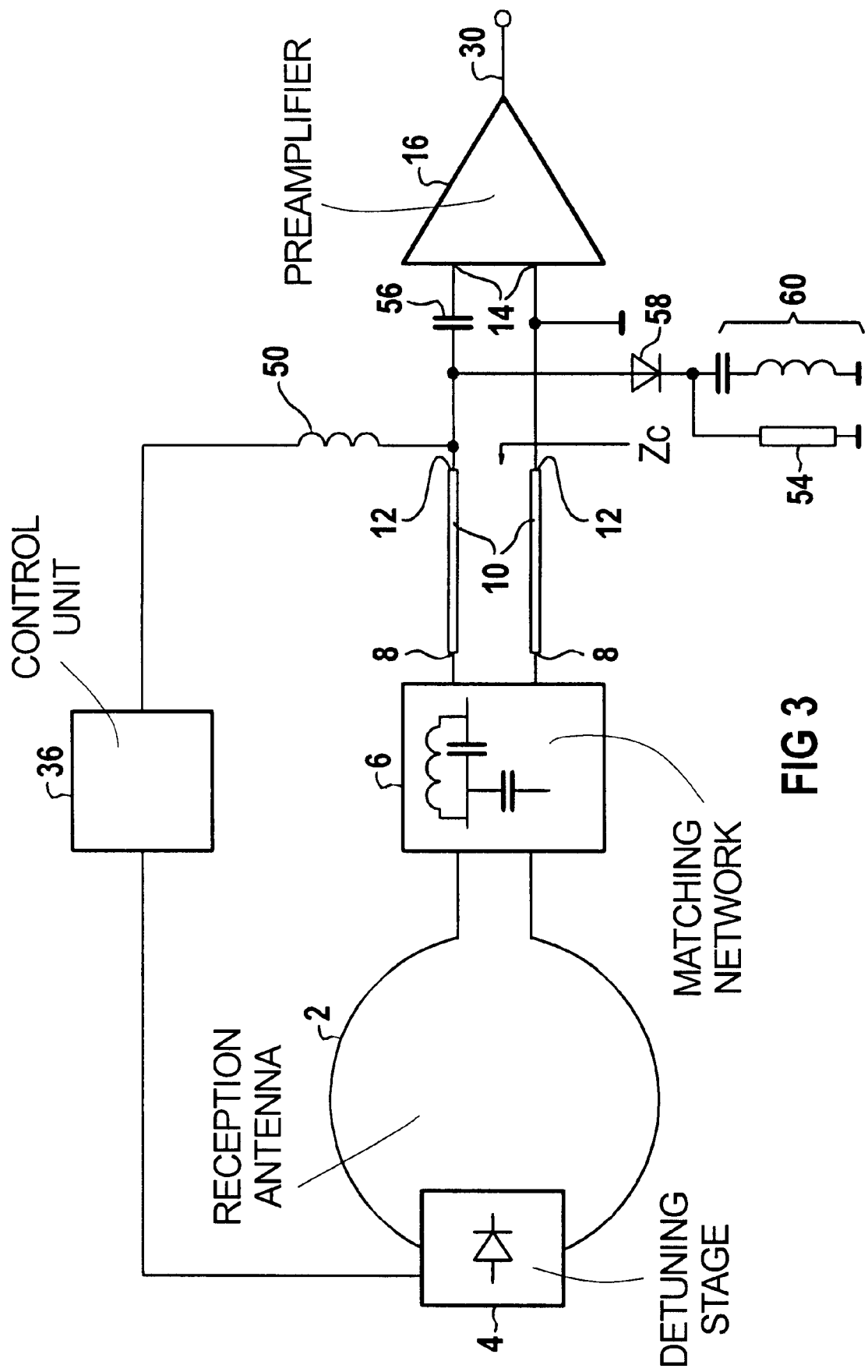
FIG. 3 shows a circuit diagram of an RF receiver unit with a connectable reactance at the preamplifier input, whereby a parallel resonance circuit is formed in a third embodiment of the invention.

In the exemplary embodiment in FIG. 3, the fact is exploited that in the detuned state of the receive antenna 2 the effective impedance Zc represents a reactance that is advantageously capacitive. The impedance Zc that is effective when the reception antenna 2 is detuned can, however, also be inductive, given a corresponding dimensioning of the RF receive unit. A switching diode 58 is connected to the signal-conducting input 14 of the preamplifier 16 (which is as shown in FIG. 1), the diode 58 being able to apply a reactance 60 to the signal line. The direct current control signals are supplied by the control unit 36 to the RF switching diode 58 via a blocking inductor 50. The takes place via the resistor 54. The reactance 60 is dimensioned so that, given a detuned reception antenna 2, it forms a parallel oscillation circuit with the effective impedance Zc. A high impedance is thereby effective at the input 14, which is transformed via the matching element 28 in the preamplifier 16 into a low source impedance.

Figure 4:
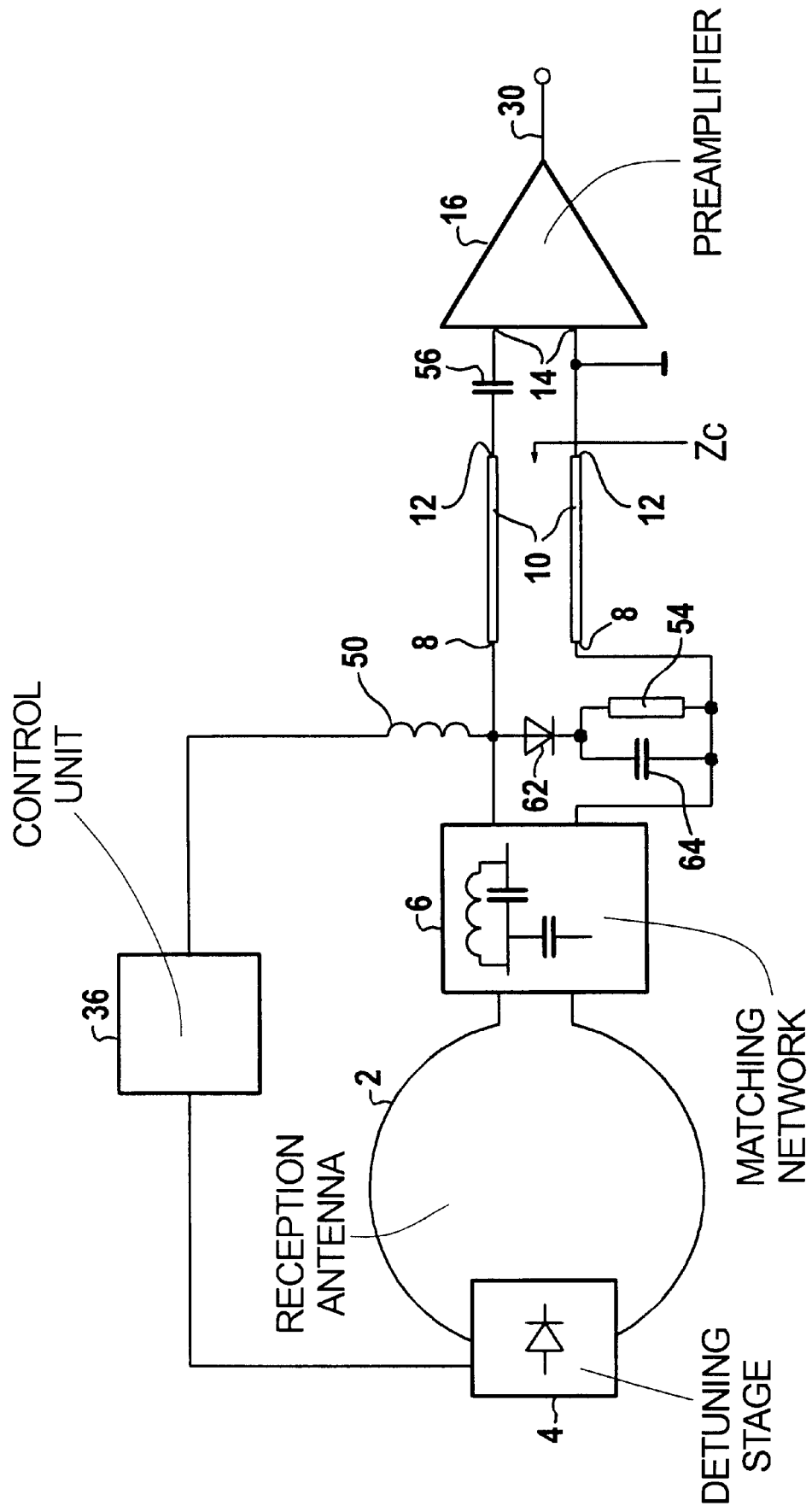
FIG. 4 shows a circuit diagram of an RF receiver unit with a switchable RF short-circuit at the input of the signal line, in a fourth embodiment of the invention.

In the exemplary embodiment shown in FIG. 4, the transformation characteristic of the signal line 10 is exploited. In the ideal case, a short-circuit at the input 8 of the signal line 10 is thereby transformed into a no-load operational state at the end of the signal line 10. The impedance effective at the input 14 of the preamplifier 16 (which is as shown in FIG. 1) is thus very high. An RF switching diode 62 is connected to the beginning 8 of the signal line 10. The diode 62, given a detuned reception antenna 2, short-circuits the beginning 8 in terms of RF when driven correspondingly by the control unit 36. The RF short circuit takes place via a capacitor 64, to which a resistor 54 is connected in parallel at the end of the control signal lead. The supply of the control signals to the RF switching diode 62 takes place via the blocking inductor 50.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A radio-frequency receiver unit for a magnetic resonance apparatus, comprising:

a reception antenna;

a noise-matched field effect transistor preamplifier having an input with a low input impedance connected to said reception antenna;

detuning means connected to said reception antenna for detuning said reception antenna at selected times, said preamplifier producing noise due to detuning of said reception antenna; and noise suppression means for interacting with said preamplifier for suppressing said noise produced by said preamplifier when said reception antenna is detuned by said detuning means.

2. A radio-frequency receiver unit as claimed in claim 1 wherein said noise suppression means is connected to said preamplifier.

3. A radio-frequency receiver unit as claimed in claim 2 wherein said noise suppression means comprise a switch connected at an output of said preamplifier, and means for activating said switch to disconnect said preamplifier from said output when said reception antenna is detuned by said detuning means.

4. A radio-frequency receiver unit as claimed in claim 3 wherein said switch comprises a radio-frequency switching diode.

5. A radio-frequency receiver unit as claimed in claim 2 wherein said noise suppression means comprises a switch connected preceding said input of said preamplifier, and means for activating said switch to disconnect said reception antenna from said input when said reception antenna is detuned by said detuning means.

6. A radio-frequency receiver unit as claimed in claim 5 wherein said switch comprises a radio-frequency switching diode.

7. A radio-frequency receiver unit as claimed in claim 2 wherein said noise suppression means comprises a series circuit comprised of a switch with a reactance, said series circuit being connected to said input of said preamplifier, and means for activating said switch to switch said reactance in parallel with said input of said preamplifier when said reception antenna is detuned by said detuning means, said reactance then forming a parallel oscillation circuit with an internal reactance of said preamplifier effective at said input of said preamplifier.

8. A radio-frequency receiver unit as claimed in claim 5 wherein said switch comprises a radio frequency switching diode.

9. A radio-frequency receiver unit as claimed in claim 1 further comprising a signal line connecting said reception antenna to said input of said preamplifier, said signal line having a beginning and an end, and said radio frequency receiver unit further comprising a matching network connected between said beginning of said signal line and said reception antenna and said end of said signal line being connected to said input of said preamplifier, and said radio-frequency receiver unit further comprising a switch connected at said beginning of said signal line, and means for activating said switch to short circuit said signal line when said reception antenna is detuned by said detuning means.

10. A radio-frequency receiver unit as claimed in claim 9 wherein said switch comprises a radio-frequency switching diode.

* * * * *